(12) United States Patent
Moon et al.

(10) Patent No.: US 7,633,577 B2
(45) Date of Patent: Dec. 15, 2009

(54) LIGHT EMITTING DIODE BACKLIGHT UNIT AND LIQUID CRYSTAL DISPLAY DEVICE USING THE SAME

(75) Inventors: Jeong Min Moon, Gyeonggi-Do (KR); Hee Jeong Park, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 379 days.

(21) Appl. No.: 11/260,240

(22) Filed: Oct. 28, 2005

(65) Prior Publication Data

US 2006/0092346 A1 May 4, 2006

(30) Foreign Application Priority Data

Oct. 30, 2004 (KR) .................. 10-2004-0087645

(51) Int. Cl.
*G02F 1/1335* (2006.01)
*F21V 7/04* (2006.01)
*G09G 3/36* (2006.01)

(52) U.S. Cl. ................... 349/69; 349/61; 345/102; 362/612; 362/631

(58) Field of Classification Search ............ 349/61, 349/69; 345/102; 362/612, 631
See application file for complete search history.

(56) References Cited

U.S. PATENT DOCUMENTS 6,983,168 B2 * 1/2006 Chen et al. ............ 455/550.1
7,113,164 B1 9/2006 Kurihara 2002/0130985 A1 * 9/2002 Weindorf et al. ........... 349/61
2002/0135997 A1 * 9/2002 Lammers .................. 362/31
2002/0175632 A1 11/2002 Takeguchi
2003/0223218 A1 * 12/2003 Kawakami ................ 362/31

FOREIGN PATENT DOCUMENTS

| CN | 1383219 A   | 12/2002 |
| CN | 1388401 A   | 1/2003  |
| CN | 2613054 Y   | 4/2004  |
| JP | 07-129098   | 10/1993 |
| JP | 07-191311   | 7/1995  |
| JP | 2001057294  | 2/2001  |
| JP | 2002-216525 | 8/2002  |
| JP | 2003-059330 | 2/2003  |
| JP | 2004-191490 | 7/2004  |
| JP | 2004-6253   | 8/2004  |

\* cited by examiner

*Primary Examiner*—Michael H Caley
(74) *Attorney, Agent, or Firm*—McKenna Long & Aldridge LLP

(57) ABSTRACT

A light emitting diode backlight unit and a liquid crystal display device having the same is provided. The light emitting diode improves efficiency of a backlight and productivity by mounting light emitting diodes and drive components onto the same printed circuit board. The light emitting diode (LED) backlight unit includes a printed circuit board, a plurality of light emitting diodes mounted onto the printed circuit board, a plurality of drive components mounted onto the printed circuit board and driving the light emitting diodes and a control unit electrically connected with the printed circuit board and controlling the drive components.

6 Claims, 5 Drawing Sheets

LIGHT EMITTING DIODE BACKLIGHT UNIT AND LIQUID CRYSTAL DISPLAY DEVICE USING THE SAME

This application claims the benefit of Korean Patent Application No. 87645/2004, filed on Oct. 30, 2004, which is hereby incorporated by reference for all purposes as if fully set forth herein.

BACKGROUND OF THE INVENTION

1. Field of the Invention

The present invention relates to a light emitting diode backlight unit, and more particularly, to a light emitting diode backlight unit that supplies light to a liquid crystal display panel through a plurality of light emitting diodes (LEDs) and a liquid crystal display (LCD) device using the same.

2. Discussion of the Related Art

In general, an LCD device is a display device displaying a desired image by individually providing data signals corresponding to image information to pixels arranged in a matrix form and controlling the light transmittance of the pixels.

Accordingly, the LCD device includes both an LCD panel where pixels are arranged in the matrix form and a driving unit for driving the pixels.

The LCD panel includes a thin film transistor array substrate and a color filter substrate which face each other and are attached such that they have a uniform cell-gap therebetween and a liquid crystal layer in the cell-gap.

A common electrode and a pixel electrode are formed on the LCD panel in which the array substrate and the color filter substrate are attached to each other in order to apply an electric field to the liquid crystal layer.

When a voltage of a data signal supplied to the pixel electrode is controlled such that a voltage is supplied to the common electrode, liquid crystal in the liquid crystal layer rotates due to a dielectric anisotropy according to the electric field formed between the common electrode and the pixel electrode. As a result, light is transmitted or blocked in each pixel thereby displaying a character or an image.

The LCD device cannot emit light on its own and instead displays an image by controlling the transmittance of light. As such, a supplementary unit such as a backlight unit for irradiating light onto the LCD panel is required.

There are two types of backlight units, a side-type and a direct type. In a side-type backlight unit, lamps are disposed at one side surface or at both side surfaces and light is reflected, diffused, and collected through a light guide plate, a reflector, and optical sheets and is then transmitted to a front surface of the LCD panel. In a direct-type backlight unit, lamps are disposed at the rear of an LCD panel such that light is directly transmitted to a front surface of the LCD panel.

FIG. 1 is a perspective view illustrating a side-type backlight unit. The side-type backlight unit includes a light guide plate 5 formed of a transparent material and disposed at the rear of an LCD panel (not illustrated), a lamp 20 disposed at the side of the light guide plate 5, a reflector 30 disposed at the rear of the light guide plate 5; a lamp reflector 25 for fixing the lamp 20 to the side of the light guide plate 5 and reflecting the light of the lamp 20 to the side of the light guide plate 5 and a line 26 for supplying power to the lamp 20.

Light generated from the lamp 20 is incident on the side of the light guide plate 5. The reflector 30 disposed at the rear of the light guide plate 5 reflects light being transmitted to the rear surface of the light guide plate 5 toward an upper surface of the light guide plate 5 thereby reducing light loss and improving uniformity.

Thus, the light guide plate 5 together with the reflector 30 transmits the light generated from the lamp 20 toward the upper surface.

FIG. 2 is a perspective view schematically illustrating a direct-type backlight unit. The direct-type backlight unit includes a reflector 30 disposed at the rear surface of an LCD panel (not illustrated), a plurality of lamps 20 disposed at an upper portion of the reflector 30 which makes light incident upon the overall rear surface of the LCD panel, a diffusion plate 40 covering the lamps 20 and diffusing light generated form the lamps 20 and lines 26 for supplying power to the lamps 20.

In general, a cold cathode fluorescent lamp (CCFL) has a tubular shape which has a length corresponding to a distance between sides of the LCD panel. A CCFL is used as the light source in a side-type backlight unit or the direct-type backlight unit. The CCFL generates white light when power is supplied through the wire 26 at both ends.

However, mercury used in the CCFL as a fluorescent material is harmful to the human body, thus, the CCFL may not satisfy environmental regulations as these regulations gradually tighten.

In addition, strides in the development of an LCD device using a time division method in which one frame of an image is time-divided into a plurality of sub-frames and red, green and blue lights are sequentially supplied to the plurality of sub-frames in order to improve the transmittance and color rendering capability of an LCD device have been recently made. However, using CCFL in a LCD device limits the application of the time division method.

Recently, a light emitting diode (LED) has been used as a backlight of the LCD device. A LED has a longer life span than the CCFL and operates on 5V. Therefore, the LED does not require an additional inverter.

A high-brightness LED has a longer life span than the related art CCFL and consumes only about 20% of the electric power required by previously available applications. Since additional equipment, such as an inverter, is not required, the high-brightness LED has advantages in that products using this type of LED have a low profile and have a more efficient inner area. In addition, the high-brightness LED has superior color generating capabilities to that of a CCFL. Furthermore, mercury controls will begin to take effect, thus increasing the demand for adopting a light emitting diode backlight.

A light emitting diode, a next generation light source which is more energy efficient than previously available light sources and can be used almost semipermanently, has been used as a main light source for mobile devices such as cellular phones, digital cameras, personal digital assistants (PDAs) and the like.

FIG. 3 is a view illustrating a typical light emitting diode backlight unit and a structure of a direct-type light emitting diode backlight using a light emitting diode.

As illustrated therein, a plurality of light emitting diodes 20A to 20C generating colors of red (R), green (G), and blue (B) are mounted onto a light emitting unit printed circuit board (PCB) 50. In addition, a driving unit printed circuit board 60 onto which drive components (not illustrated) for driving the LEDs are mounted is constructed in the form of another PCB outside the light emitting diode backlight.

Furthermore, a control unit printed circuit board 70 which outputs signals that control the drive components is electrically connected to the driving unit PCB 60.

A reference numeral 10 denotes a light emitting diode backlight in which the light emitting unit PCB 50 is located.

In the typical light emitting diode backlight structure having such a construction, a long signal line for transmitting a signal between the light emitting diode and the driving unit PCB is required. A long signal line causes a serious voltage drop in the LED backlight circuit. The brightness of the LED changes according to electric current. As such, the voltage drop minimizes the efficiency of the LED backlight. In addition, since additional processes are required such as designing the additional driving unit PCB and coupling with the light emitting printed circuit board, productivity is decreased.

SUMMARY OF THE INVENTION

Accordingly, the present invention is directed to a light emitting diode backlight unit and liquid crystal display device using the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided a light emitting diode backlight unit which includes a printed circuit board and a plurality of light emitting diodes mounted on the printed circuit board. The LED backlight unit also has a plurality of drive components mounted on the printed circuit board and driving the light emitting diodes and a control unit operatively coupled with the printed circuit board and controlling the drive components.

To achieve these and other advantages and in accordance with the purpose of the present invention, as embodied and broadly described herein, there is provided a light emitting diode backlight unit including a first printed circuit board and a plurality of light emitting diodes mounted on the first printed circuit board. In addition, the LED backlight unit includes a second printed circuit board operatively coupled with the first printed circuit board with a connector. The second printed circuit board has a plurality of drive components for driving the LEDs mounted thereon. The LED backlight unit also has a control unit operatively coupled with the second printed circuit board which controls the drive components.

To achieve these and other advantages and in accordance with the purpose of the present invention, as embodied and broadly described herein, there is provided a liquid crystal display device including a liquid crystal display (LCD) panel and a light emitting diode backlight unit installed at the rear or side of the LCD panel and irradiating light onto the LCD panel. The light emitting diode backlight unit has a printed circuit board, a plurality of light emitting diodes mounted on the printed circuit board, and a plurality of drive components driving the light emitting diodes. In this embodiment, the plurality of drive components are mounted on the printed circuit board. The liquid crystal display device also has a case coupling the LCD panel and the backlight unit to each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Hereinafter, embodiments of a light emitting diode backlight unit and a liquid crystal display device using the same in accordance with the present invention will be described in detail in the accompanying drawings.

Figure 1:
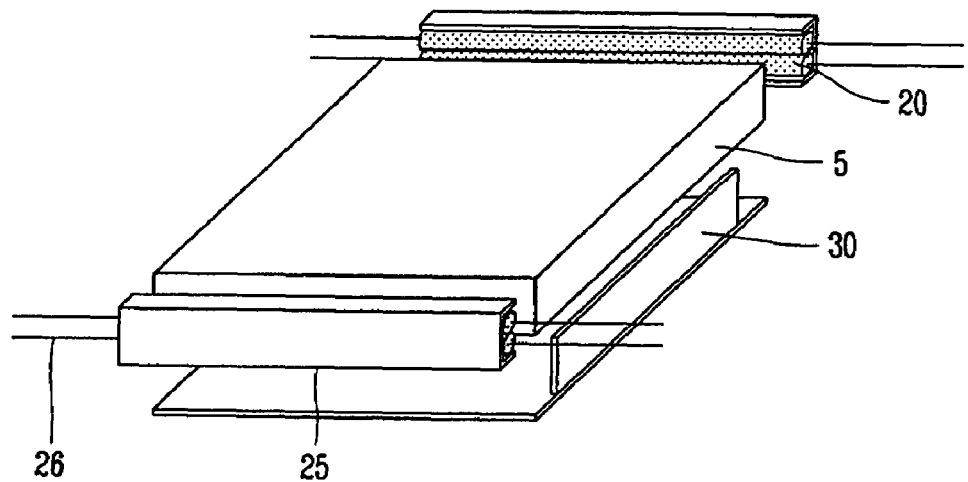
FIG. 1 is a perspective view illustrating a related art side-type backlight unit.
Figure 2:
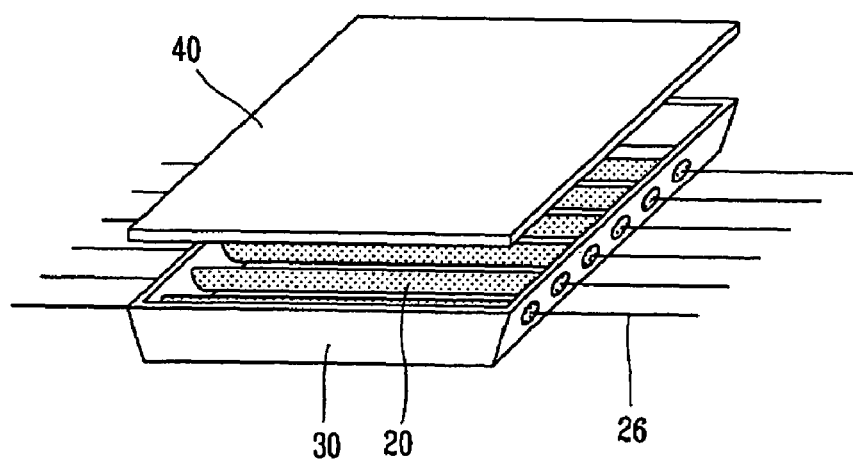
FIG. 2 is a perspective view illustrating a related art direct-type backlight unit.
Figure 3:
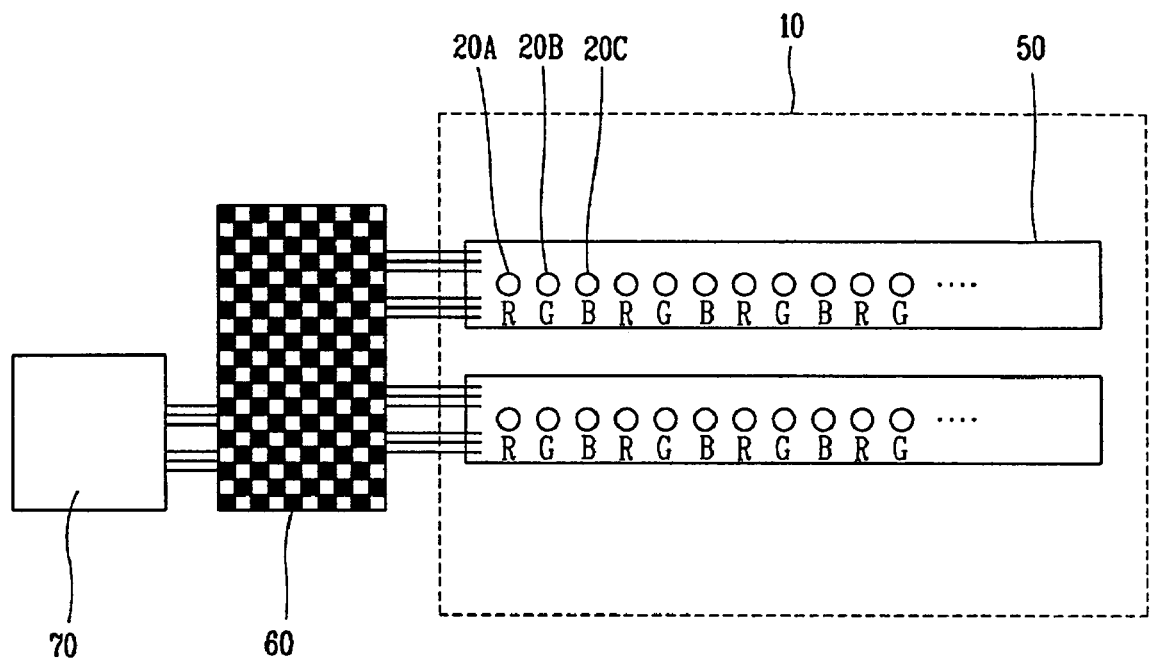
FIG. 3 is a view illustrating a related art light emitting diode backlight unit.
Figure 4:
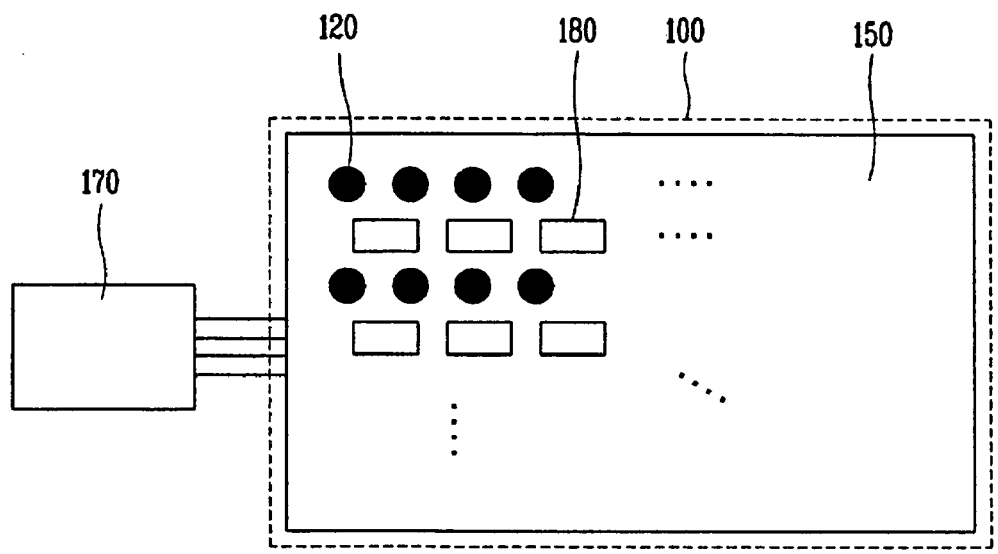
FIG. 4 is a view showing a light emitting diode backlight unit in accordance with a first embodiment of the present invention.

FIG. 4 is a view schematically illustrating a light emitting diode backlight unit in accordance with a first embodiment of the present invention.

Here, a direct-type light emitting diode backlight structure is shown as one example in the drawing, but the present invention is not limited to this. The present invention may also be applied to a side-type backlight structure.

As illustrated therein, a plurality of light emitting diodes 120 generating red, green and blue colors and a plurality of drive components 180 for driving the LEDs 120 are mounted onto a light emitting unit printed circuit board (PCB) 150. The LEDs 120 and the drive components 180 are mounted together onto the light emitting unit PCB 150 and are positioned in a light emitting diode backlight 100.

Here, the LEDs 120 of the present embodiment may have a structure in which one light emitting diode device which generates red, green or blue color is embedded in a light emitting diode lamp in the form of a lamp or a chip.

In the following, one light emitting diode device embedded in one light emitting diode lamp is described. However, it should be noted that the present invention is not limited to this description. The present invention can be also applied when all the LED devices which generate red, green and blue color, respectively, are embedded in one light emitting diode lamp.

In addition, the following description relates to a light emitting diode device which generates red, green or blue color as an example. However, the light emitting diode 120 may include a light emitting diode device which generates white light or light having multiple colors as well as the red, green and blue colors. In addition, the light emitting diode 120 may include a plurality of LED devices which generate different colors. The light emitting diodes 120 may also be divided into a different number of groups which generate colors which vary according to the groups.

The light emitting unit PCB 150 may include a metal core printed circuit board (MCPCB) in which an aluminum layer is laminated on its lower surface SO as to emit heat being generated by the light emitting diodes 120 to the outside.

In addition, the light emitting unit PCB 150 is electrically connected with a control unit printed circuit board 170 to output a signal which controls the drive components 180.

As described above, in the existing LED backlight structure, while the LEDs are mounted onto the light emitting unit PCB and are located in the backlight, the drive components for driving the LEDs are mounted onto the driving unit PCB located outside the LED backlight. However, in the present embodiment, the light emitting diodes 120 and the LED drive components 180 are mounted together onto the MCPCB 150, that is, onto the same printed circuit board. As such, production efficiency is maximized and the efficiency of the LED backlight is improved because a decrease in voltage which normally occurs from signal line resistance between the light emitting diodes 120 and the drive components 180 is minimized.

In addition, in the structure, a PWM (Pulse Width Modulation) signal for controlling the LEDs 120 is transmitted from the control unit PCB 170 for the control and output of the PWM signal to the LED drive components 180 to thereby duty control electric currents of the LEDs 120.

Likewise, a method to control the brightness of an entire screen through duty control is used and a method for driving a light emitting diode array in series is used in a light emitting diode. However, series driving makes it difficult to locally control brightness in a large LCD device.

By supplying power (Vcc) to red, green and blue light emitting diodes or a white light emitting diode and performing on/off control on each light emitting diode, the present embodiment can be applied in a structure enabling independent driving of the light emitting diodes. That is, different signals are supplied from a PWM control unit to each divided region and individually controlled current is applied to each light emitting diode, thereby controlling brightness. In addition, independently driving red, green and blue light emitting diodes allows for controlling color temperature and color coordinate characteristics.

As described above, the light output of the light emitting diode depends on a light emitting diode current and the light emitting diode current depends on a light emitting diode applied voltage.

Figure 5A:
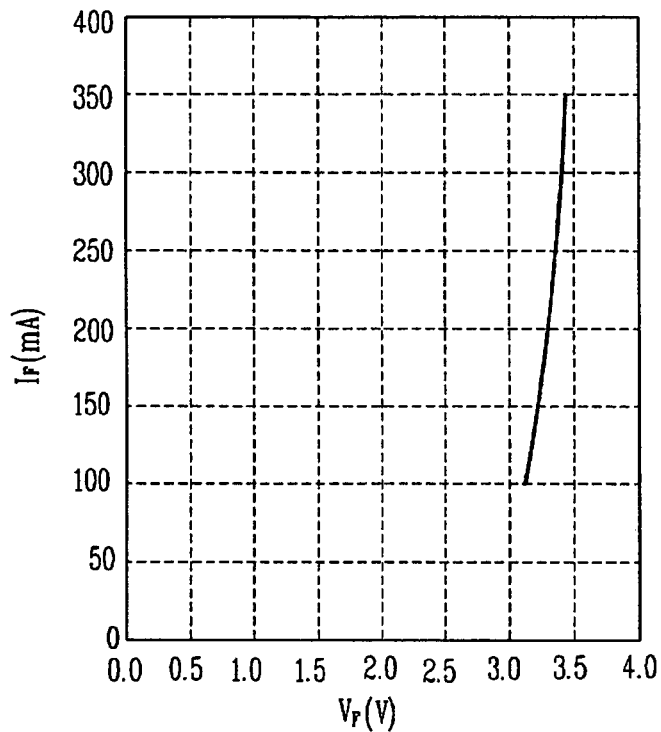
FIGS. 5A and 5B are graphs illustrating a current-voltage characteristic of a light emitting diode.
Figure 5B:
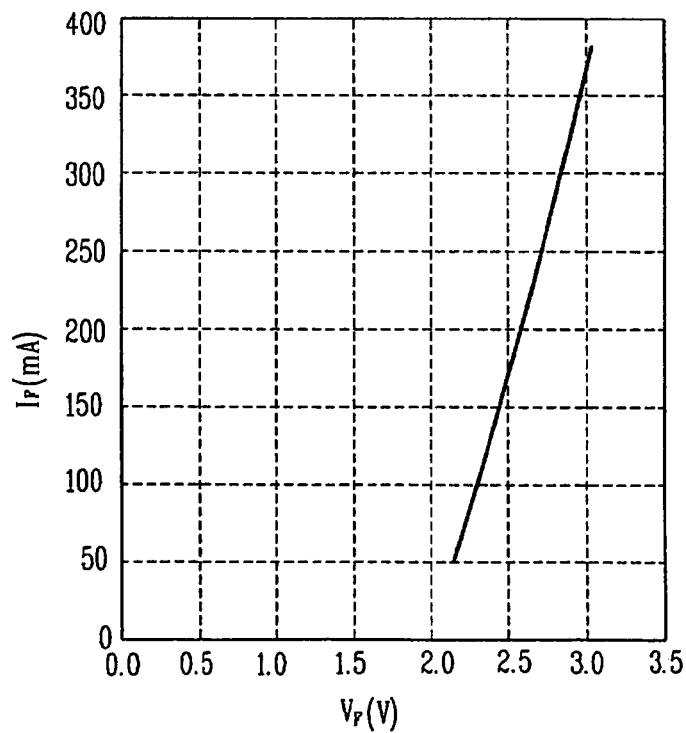
Figure 6A:
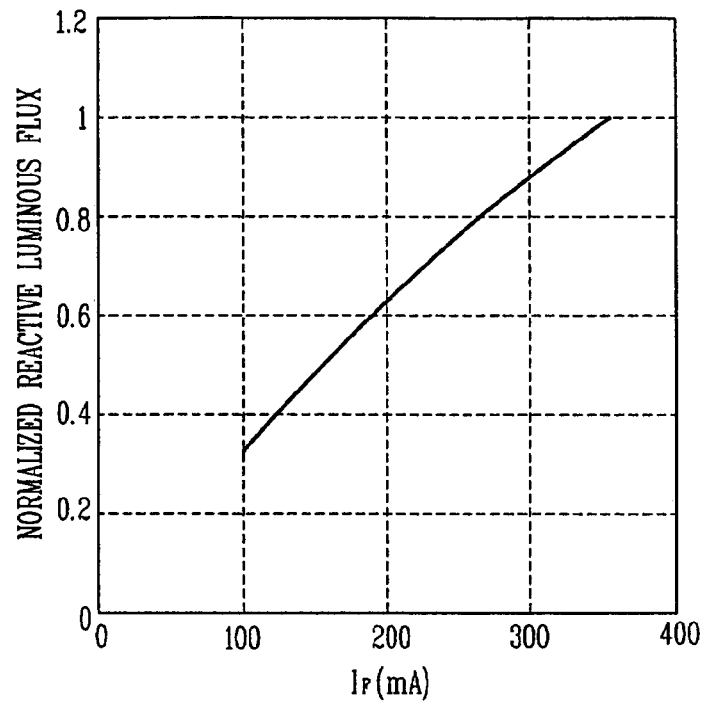
FIGS. 6A and 6B are graphs illustrating a current-brightness characteristic of the light emitting diode.
Figure 6B:
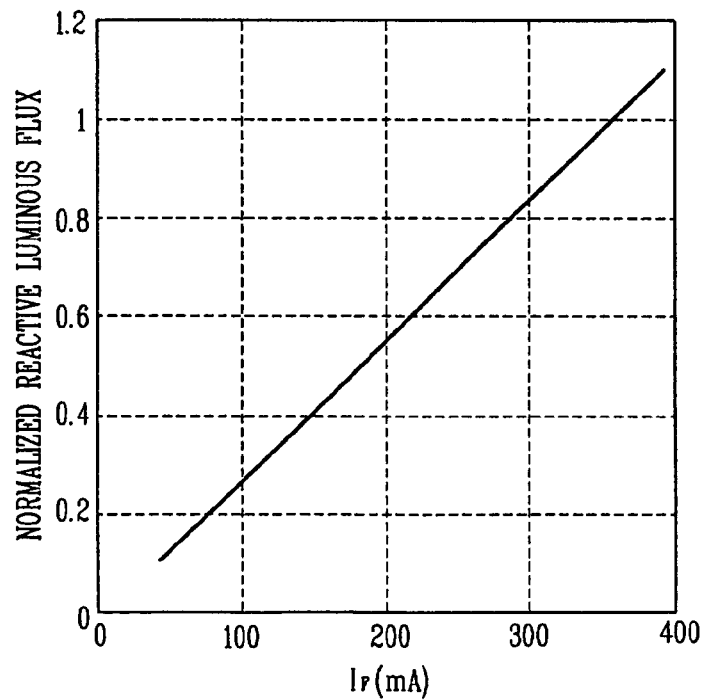

FIGS. 5A and 5B are graphs showing a current-voltage characteristic of a light emitting diode, and FIGS. 6A and 6B are graphs showing a current-brightness characteristic of the light emitting diode.

Here, the graph shows current-voltage and current-brightness characteristics of a 1 W light emitting diode. FIGS. 5A and 6A show electric and optical characteristics of green and blue light emitting diodes and FIGS. 5B and 6B show electrical and optical characteristics of a red light emitting diode.

In addition, the graphs in FIGS. 5A and 5B show an average forward current (mA) against a forward voltage (V) of the light emitting diode. The graphs in FIGS. 6A and 6B show a normalized reactive luminous flux against a forward current (mA) of the light emitting diode.

With reference to the drawings, a change in current occurs according to a change in voltage being applied to the light emitting diode. The change of the current brings about a change in brightness characteristics of the light emitting diode.

A voltage drop which results from resistance in a signal line which connects the light emitting diode and the drive component affects the light output of the light emitting diode. Thus, an increase in resistance decreases light output uniformity and the efficiency of the light emitting diode backlight. However, in accordance with the present invention, because drive components and light emitting diodes are mounted onto a driving unit PCB, resistance of a signal line between the light emitting diodes and the LED drive components is minimized, thereby solving the aforementioned problem.

In general, the light efficiency of a light emitting diode is very low, typically about 30-50% of the light efficiency of a CCFL. Thus, when the light emitting diode is implemented in the backlight, additional heat is generated. Therefore, when light emitting diodes and drive components are mounted on the same printed circuit board in accordance with the first embodiment, the drive components may be affected by heat emitted from the light emitting diodes. A second embodiment which addresses this will be described in detail with reference to the drawings.

Figure 7:
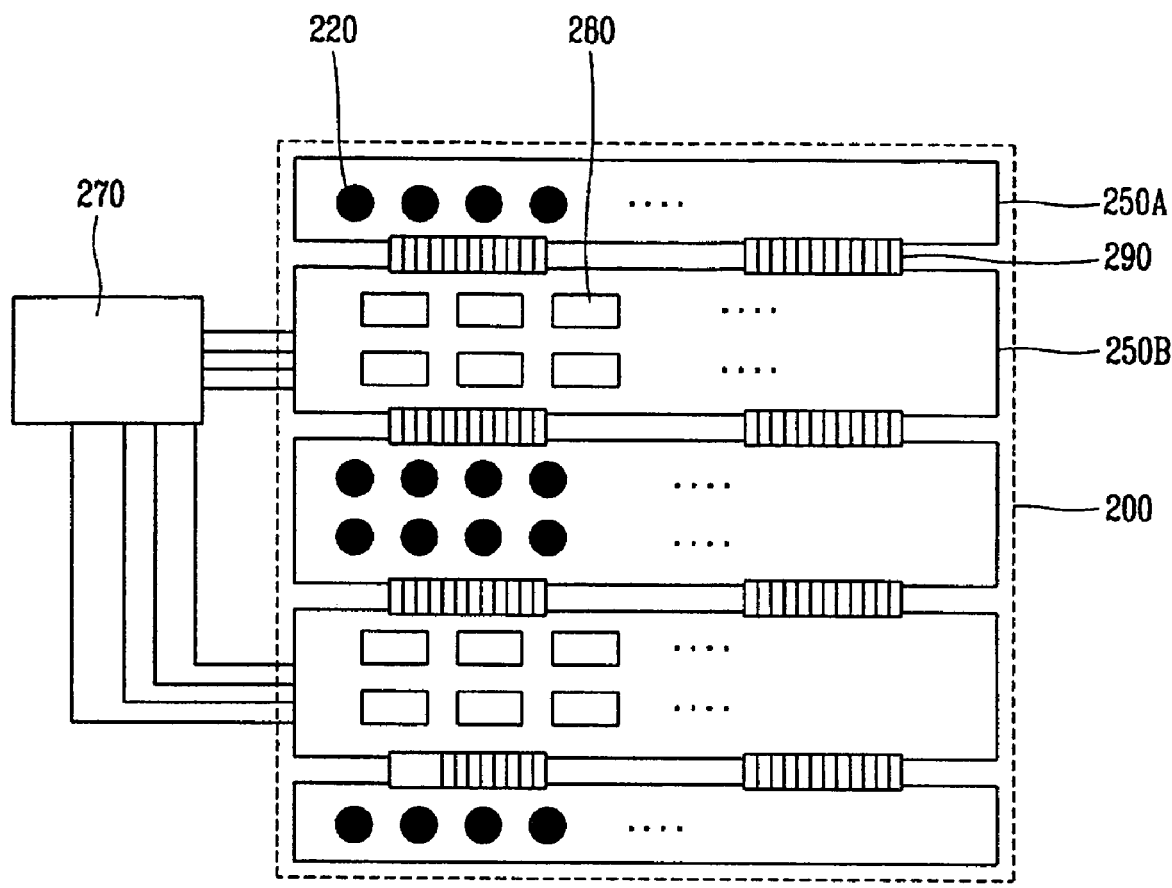
FIG. 7 is a view showing a light emitting diode backlight in accordance with a second embodiment of the present invention.

FIG. 7 illustrates a light emitting diode backlight unit in accordance with a second embodiment of the present invention.

As illustrated therein, a plurality of first printed circuit boards 250A for mounting light emitting diodes 220 in a light emitting diode backlight 200 and a plurality of second printed circuit boards 250B for mounting light emitting diode drive components 280 are separately provided. The first printed circuit boards 250A and the second printed circuit boards 250B are electrically connected with each other through a plurality of connectors 290. The separation of the light emitting diodes 220 and the light emitting diode drive components 280 minimizes the effect heat generated from the light emitting diodes 220 may have on the light emitting diode drive components 280.

Mounting the light emitting diodes 220 and the LED drive components 280 on the printed circuit boards 250A and 250B increases the ease with which operations may be performed in comparison with a configuration where light emitting diode drive components are mounted on a printed circuit board separate from a light emitting diode backlight, as shown in the related art.

A reference numeral 270 denotes a control unit printed circuit board electrically connected with the second printed circuit boards 250B. The control unit printed circuit board 270 supplies control signals to the LED drive components 280 mounted onto the second printed circuit boards 250B.

The LED backlight unit in accordance with the present invention takes the place of a cold cathode fluorescent lamp which is harmful to the human body and therefore may not satisfy evolving environmental regulations. The LED backlight unit in accordance with the present invention may also be used to supply light to a flat panel display device as well as a liquid crystal display device.

In addition, the LED backlight unit in accordance with the present invention may be applied to a liquid crystal display device in a time division method in which one frame of an image is time-divided into a plurality of sub-frames in order to improve transmittance and color rendering capability and red, green and blue lights are sequentially activated during the plurality of sub-frames to display an image.

Hereinafter, an LCD device having the light emitting diode backlight unit of the present invention will be described.

An LCD device includes an LCD panel where pixels are arranged in a matrix form, a gate driving circuit unit and a data driving circuit unit connected to side surfaces, respectively, of the LCD panel. The LCD device also has a backlight unit installed at the rear or side of the LCD panel.

The LCD panel includes an array substrate and a color filter substrate which face each other and are attached to maintain a uniform cell-gap therebetween. Additionally, a liquid crystal layer is formed in the cell-gap.

A common electrode and a pixel electrode are formed on the LCD panel where the array substrate and the color filter substrate are attached to each other in order to apply an electric field to the liquid crystal layer. If a voltage of a data signal which is supplied to the pixel electrode is controlled such that a voltage is supplied to the common electrode, liquid crystal in the liquid crystal layer rotates due to a dielectric anisotropy according to the electric field formed between the common electrode and the pixel electrode. As a result, light is transmitted or blocked by pixels to display a character or an image. In order to control the voltage of the data signal which is supplied to the pixel electrode by pixels, a switching device such as a thin film transistor (TFT) is provided on each pixel.

The gate driving circuit unit and the data driving circuit unit are coupled with the LCD panel in various forms and provide scanning signals and image information to a plurality of gate lines and data lines, thereby driving pixels of the LCD panel.

An integral type LED backlight unit in accordance with the present invention is installed at the rear or side of the LCD panel. In the integral type LED backlight unit, drive components for driving light emitting diodes are mounted onto a printed circuit board onto which the light emitting diodes are mounted, thereby improving efficiency of the LED backlight and simultaneously enhancing productivity by simplifying a fabrication procedure for the LCD device.

The LCD panel and the backlight unit are supported and coupled with each other by a bottom cover disposed at the rear of the backlight unit. The bottom cover can be engaged with a mold frame through a screw.

The bottom cover and the mold frame can be coupled with each other by a hook method for speeding the assembly process. That is, by forming an insertion groove on the bottom cover and a hook on the mold frame and inserting the hook of the mold frame into the insertion groove, the bottom cover and the mold frame can be coupled with each other. Here, the hook can be formed on the bottom cover and the insertion groove can be formed on the mold frame.

In addition, an edge of an upper surface of the mold frame coupled with the bottom cover is compressed by a top case. The top case can be coupled with the mold frame by a screw or hook method.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED) backlight unit comprising:
   a first printed circuit board, wherein the first printed circuit board is constructed as an metal core printed circuit board (MCPCB) in which an aluminum layer is laminated at a lower surface;
   a plurality of light emitting diodes (LEDs) mounted on the first printed circuit board;
   a second printed circuit board operatively coupled with the first printed circuit board with a connector, the second printed circuit board having a plurality of drive components mounted thereon for driving the light emitting diodes; and
   a control unit mounted on a third printed circuit board to output a signal which controls the plurality of drive components,
   wherein the third printed circuit board is electrically connected with the second printed circuit board,
   wherein the control unit transmits a pulse width modulation (PWM) signal for controlling the LEDs to the drive components to thereby duty control electric currents of the LEDs, and
   wherein the control unit supplies different signals and individually controlled currents to each of the LEDs, thereby controlling brightness respectively.

2. The LED backlight unit of claim 1, wherein one of the plurality of LEDs generates at least one color of red, green and blue.

3. The LED backlight unit of claim 1, wherein one of the plurality of LEDs generates white light.

4. The LED backlight unit of claim 1, wherein one of the plurality of LEDs is embedded in one lamp thereby generating at least one color of red, green, blue and white.

5. The LED backlight unit of claim 1, wherein all the LEDs which generate red, green and blue are embedded in one lamp.

6. A liquid crystal display device comprising:
   a liquid crystal display (LCD) panel;
   a light emitting diode backlight unit installed at the rear or side of the LCD panel and irradiating light onto the LCD panel, the light emitting diode backlight unit comprising:
   a first printed circuit board, wherein the first printed circuit board is constructed as an metal core printed circuit board (MCPCB) in which an aluminum layer is laminated at a lower surface;
   a plurality of light emitting diodes mounted on the first printed circuit board;
   a second printed circuit board operatively coupled with the first printed circuit board with a connector, the second printed circuit board having a plurality of drive components mounted thereon for driving the light emitting diodes; and
   a control unit mounted on a third printed circuit board to output a signal which controls the plurality of drive components,
   wherein the third printed circuit board is electrically connected with the second printed circuit board,
   wherein the control unit transmits a pulse width modulation (PWM) signal for controlling the LEDs to the drive components to thereby duty control electric currents of the LEDs, and
   wherein the control unit supplies different signals and individually controlled currents to each of the LEDs, thereby controlling brightness respectively; and
   a case for coupling the LCD panel and the backlight unit with each other.

* * * * *